(12) United States Patent
Kabe et al.

(10) Patent No.: US 7,050,952 B2
(45) Date of Patent: May 23, 2006

(54) METHOD OF DESIGNING RUBBER COMPOSITE

(75) Inventors: Kazuyuki Kabe, Hiratsuka (JP); Tsuneo Morikawa, Hiratsuka (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 832 days.

(21) Appl. No.: 09/973,758

(22) Filed: Oct. 11, 2001

(65) Prior Publication Data

US 2002/0049574 A1 Apr. 25, 2002

(30) Foreign Application Priority Data

Oct. 16, 2000 (JP) ............... 2000-315249

(51) Int. Cl.
| | |
|---|---|
| G06F 17/10 | (2006.01) |
| G06F 7/60 | (2006.01) |
| G06G 7/48 | (2006.01) |

(52) U.S. Cl. ............................. 703/2; 703/8
(58) Field of Classification Search .............. 703/2, 703/8
See application file for complete search history.

(56) References Cited

U.S. PATENT DOCUMENTS

| | | | |
|---|---|---|---|
| 5,559,729 A * | 9/1996 | Abe ............................ 703/2 |
| 5,710,718 A * | 1/1998 | Kamegawa et al. ........... 703/1 |
| 5,930,155 A * | 7/1999 | Tohi et al. ..................... 703/8 |
| 6,083,268 A * | 7/2000 | Kelsey et al. .................. 703/7 |
| 6,199,026 B1 * | 3/2001 | Shiraishi et al. ............ 702/140 |
| 6,531,012 B1 * | 3/2003 | Ishiyama ................. 156/110.1 |
| 6,697,772 B1 * | 2/2004 | Mancosu et al. .............. 703/2 |

* cited by examiner

Primary Examiner—Paul L. Rodriguez
Assistant Examiner—Dwin M. Craig
(74) Attorney, Agent, or Firm—Rader, Fishman & Grauer

(57) ABSTRACT

Disclosed is a method of designing rubber composite executed as follows. A shape of the rubber composite, a shape of the each part (i) constituting the rubber composite and physical properties of a rubber material used for each part (i) are tentatively selected respectively. Thereafter, the rubber composite is divided into many finite elements, and strain in each element is calculated by the finite element method to obtain maximum principal strain $(\epsilon_i)_{max}$ of the elements in each part (i). Then, the tentative selections of the shape of the rubber composite, the shape of each part (i) and the physical properties of the rubber material, and the calculations by the finite element method are repeated until an allowance ratio $S_{ia}$ calculated as a ratio of strain $(\epsilon_i)_b$ at break to the maximum strain $(\epsilon_i)_{max}$ becomes equal to a specified reference allowance ratio $S_0$ or higher in all of the parts (i). The shape of the rubber composite, the shape of each part (i) and the physical properties of the rubber material are thus determined.

4 Claims, 3 Drawing Sheets

METHOD OF DESIGNING RUBBER COMPOSITE

BACKGROUND OF THE INVENTION

1. Field of the Invention

The present invention relates to a method of designing rubber composite such as a pneumatic tire. More particularly, the present invention relates to a method of designing rubber composite in which, when designing rubber composite having high durability using the finite element method, a shape of the rubber composite, physical properties of a rubber material and physical properties of a reinforcement are efficiently selected, thus making it possible to obtain the durability as expected at the time of designing.

2. Description of the Related Art

In the method of designing the pneumatic tire or the like, it has been heretofore well known that a durability simulation is conducted by the use of the finite element method (hereinafter, abbreviated as FEM). The FEM has been established as a method for evaluating durability of a tire especially in designing a pneumatic tire for a heavy loading purpose used for a bus and a truck or in designing a pneumatic tire used for a light truck.

However, in the conventional method of designing a pneumatic tire using the FEM, simply air pressure and a rim were set to the pneumatic tire, and a desirable vertical load was applied thereto, followed by comparative review of magnitude of strain, stress or strain energy generated in each element. Thus, a shape of a tire, a shape of each part and physical properties of a rubber material were tentatively selected, and calculations using the FEM were repeated by trial and error based on the result of the tentative selections, whereby selecting the shape and the physical properties of the rubber material such that the strain, stress, and strain energy become relatively small.

However, according to the above-described method of designing, though it was expected that a defect would occur in a portion where the strain, the stress or the strain energy became the largest by the calculation, the defect sometimes occurred in a portion where the strain, the stress or the strain energy was calculated to be small in an actual durability test. Specifically, the actual result and the simulation result were not always consistent with each other.

For example, when principal strain of a belt edge cushion of a belt portion was 30% and principal strain of a carcass turnup around a bead portion was 20% as the FEM calculation result, according to the conventional notion, the belt edge cushion of the belt portion having larger principal strain was simply considered to be inferior to the carcass turnup around the bead portion in durability. However, actual tire durability was not consistent with such result in many cases.

SUMMARY OF THE INVENTION

The object of the present invention is to provide a method of designing rubber composite, which solves the foregoing conventional problems and makes a result of a durability simulation by the FEM and a result of an actual durability test properly consistent with each other.

To achieve the foregoing object, in the present invention, three methods of designing (1), (2) and (3) shown below are provided. These three methods of designing may be implemented separately, or alternatively, implemented as a combination two or more methods.

(1) A method of designing rubber composite is executed as follows. A shape of rubber composite, a shape of each part (i) constituting the rubber composite and physical properties of a rubber material used for each part (i) are tentatively selected respectively. Thereafter, the rubber composite is divided into many finite elements, and also strain in each element is calculated by the FEM to obtain maximum principal strain $(\epsilon_i)_{max}$ of the element in each part (i). Then, the tentative selections of the shape of the rubber composite, the shape of each part (i) and the physical properties of the rubber material and the calculations by the FEM are repeated until an allowance ratio $S_{ia}$, which is calculated as a ratio of strain $(\epsilon_i)_b$ at break to the maximum strain $(\epsilon_i)_{max}$, becomes equal to a specified reference allowance ratio $S_0$ or higher in all of the parts (i) whereby determining the shape of the rubber composite, the shape of each part (i) and the physical properties of the rubber material.

(2) A method of designing rubber composite is executed as follows. A shape of rubber composite, a shape of each part (i) constituting the rubber composite and physical properties of a rubber material used for each part (i) are tentatively selected respectively. Thereafter, the rubber composite is divided into many finite elements, and also stress in each element is calculated by the FEM to obtain maximum principal stress $(\sigma_i)_{max}$ of the element in each part (i). Then, the tentative selections of the shape of the rubber composite, the shape of each part (i) and the physical properties of the rubber material and the calculations by the FEM are repeated until an allowance ratio $S_{ib}$, which is calculated as a ratio of stress $(\sigma_i)_b$ at break to the maximum stress $(\sigma_i)_{max}$, becomes equal to a specified reference allowance ratio $S_0$ or higher in all of the parts (i) whereby determining the shape of the rubber composite, the shape of each part (i) and the physical properties of the rubber material.

(3) A method of designing rubber composite is executed as follows. A shape of rubber composite, a shape of each part (i) constituting the rubber composite and physical properties of a rubber material used for each part (i) are tentatively selected respectively. Thereafter, the rubber composite is divided into many finite elements, and strain energy in each element is calculated by the FEM to obtain density $(\Pi_i)_{max}$ of maximum strain energy of the element in each part (i). Then, the tentative selections of the shape of the rubber composite, the shape of each part (i) and the physical properties of the rubber material and the calculations by the FEM are repeated until an allowance ratio $S_{ic}$, which is calculated as a square root of a ratio of density $(\Pi_i)_b$ of strain energy at break to the density $(\Pi_i)_{max}$ of maximum strain energy, becomes equal to a specified reference allowance ratio $S_0$ or higher in all of the parts (i) whereby determining the shape of the rubber composite, the shape of each part (i) and the physical properties of the rubber material.

In the present invention, the shape of the rubber composite, the shape of each part and the physical properties of the rubber material are not determined by simply comparing magnitude of the maximum principal strain, the maximum principal stress and the maximum strain energy density. The present invention is characterized in that the concept of the allowance ratio is introduced to designing. Specifically, the shape of the rubber composite, the shape of each part and the physical properties of the rubber material are determined such that the allowance ratio $S_{ia}$, the allowance ratio $S_{ib}$ and the allowance ratio $S_{ic}$ become equal to the specified reference allowance ratio $S_0$ or higher respectively. Herein, the allowance ratio $S_{ia}$ is calculated as a ratio of the strain $(\epsilon_i)_b$ at break to the maximum principal strain $(\epsilon_i)_{max}$, the allowance ratio $S_{ib}$ is calculated as a ratio of the stress $(\sigma_i)_b$ at break to the maximum principal stress $(\sigma_i)_{max}$, and the allowance ratio $S_{ic}$ is calculated as a square root of a ratio of the density $(\Pi_i)_b$ of strain energy to the density $(\Pi_i)_{max}$ of maximum strain energy. As described above, the shape of the rubber composite, the shape of each part and the physical properties of the rubber material are determined while the concept of the allowance ratio is introduced, and a result of a durability simulation by the FEM and a result of a durability test obtained by an actual test thus become properly consistent with each other, whereby further enhancing accuracy of the simulation by the FEM.

Specifically, in the present invention, not only the result obtained from the FEM analysis but also potential (the strain at break, in this case) of the materials used therein is taken into consideration, and the concept of the allowance ratio is introduced by taking the ratio thereof. Due to the introduction of the concept of the allowance ratio, an evaluation method with higher accuracy can be obtained as not only the result of the mere FEM analysis but alto the potential of the materials is taken into consideration and evaluated.

In the example where the principal strain of the belt edge cushion of the belt portion is 30% and the principal strain of the carcass turnup around the bead portion is 20% as calculation results by the FEM, if the strain at break of the material of the carcass turnup around the bead portion is 200% and the strain at break of the material of the belt edge cushion of the belt portion is 450%, the allowance ratios is 10 in the carcass turnup around the bead portion while it is 15 in the belt edge cushion of the belt portion. In this case, the carcass turnup around the bead portion having smaller principal strain in the FEM analysis result is considered to have inferior durability to the belt edge cushion in the belt portion. In fact, there have been many such cases.

DESCRIPTION OF THE PREFERRED EMBODIMENTS

Figure 1:
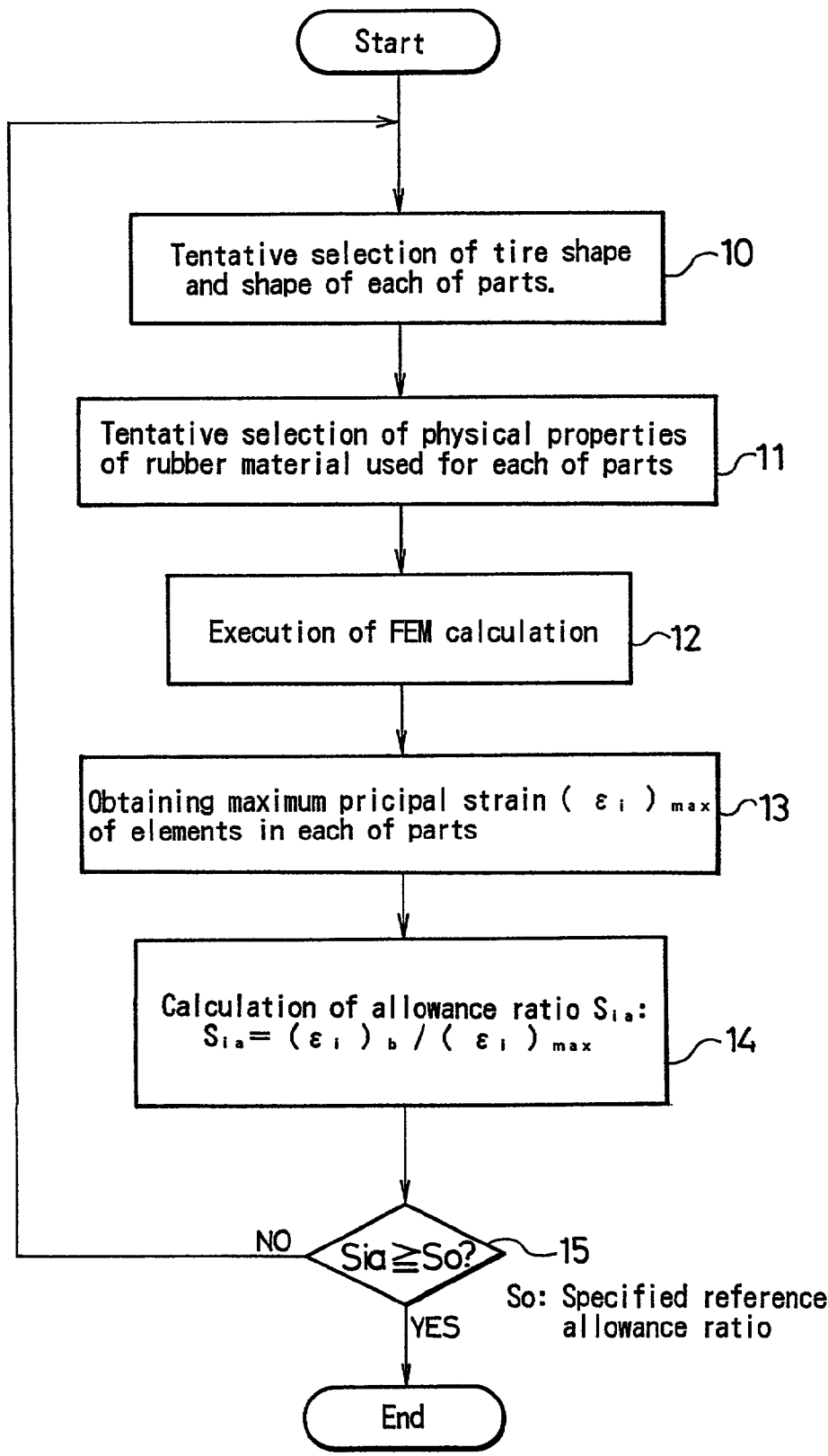
FIG. 1 is a flow chart showing an example of a method of designing rubber composite according to the present invention.

In the present invention, "rubber composite" means a rubber molding, which is reinforced by the use of a reinforcement such as organic fiber cords or steel cords. As a typical example of this rubber composite, a pneumatic tire, a rubber hose and a conveyer belt can be enumerated for example.

As described above, the finite element method (FEM) is a method frequently used in a durability simulation when designing the pneumatic tire. Specifically, this is a method that the rubber composite to be designed is divided into a many finite number of elements each called a finite element, and a whole system, in which properties are applied to each of the elements, is subjected to a numerical analysis by the use of a computer. Note that, as a document presenting a case where the finite element method is used in a structure analysis of the tire and the like, "Finite Element Analysis" in the Journal of The Society of Rubber Industry, Japan, Vol. 62, No. 4, P204 (1989) and the like can be enumerated for example. In addition, an analysis system by the FEM for estimating tire performance is also presented in the gazette of Japanese patent application Kokai publication No. 11(1999)-153520.

In the present invention, principal strain means strain obtained by combining six elements $\epsilon_x$, $\epsilon_y$, $\epsilon_z$, $\gamma_{xy}$, $\gamma_{yz}$ and $\gamma_{xz}$ when vertical strain $\epsilon$ and shearing strain $\gamma$ generated in each of the finite number of elements described above are represented as the six elements $\epsilon_x$, $\epsilon_y$, $\epsilon_z$, $\gamma_{xy}$, $\gamma_{yz}$ and $\gamma_{xz}$ in three-dimensional coordinates x, y and z. Also, maximum principal strain means principal strain, which shows the largest value of the principal strain generated respectively in the plurality of finite elements contained in each part.

In addition, principal stress means stress obtained by combining six elements $\sigma_x$, $\sigma_y$, $\sigma_z$, $\tau_{xy}$, $\tau_{yz}$ and $\tau_{xz}$ when vertical stress $\sigma$ and shearing stress $\tau$ generated in each of the finite number of elements are similarly represented as the six elements $\delta_x, \delta_y$, $\delta_z$, $\tau_{xy}$, $\tau_{yz}$ and $\tau_{xz}$ in three-dimensional coordinates x, y and z. Also, maximum principal stress means principal stress, which shows the largest value of the principal stress generated respectively in the plurality of finite elements contained in each part.

Strain energy density means an amount represented by an area surrounded by an S-S curve and a horizontal axis when the stress $\sigma$ is shown on a vertical axis, the strain $\epsilon$ is shown on the horizontal axis, and the stress-strain curve (S-S curve) is drawn. Density of strain energy at break means an amount represented by an area surrounded by the S-S curve and the horizontal axis up to a break point $(\epsilon_b)$. Also, maximum strain energy density means the largest strain energy density generated in each of the elements in one revolution of a tire according to the result of the simulation.

Hereinafter, description will be made for a design of a pneumatic radial tire based on the present invention with reference to a flow chart shown in FIG. 1. In this case, a simulation regarding the strain is performed by the use of a computer.

After starting a program, first in step 10, a targeted shape of a tire and a shape of each part constituting the tire are tentatively selected. Next, in step 11, physical properties of a rubber material used in each part are tentatively selected. Since a principal framework of the tire shape is almost experientially determined in accordance with applications of the tire, such as for a passenger car or for heavy loading, tentative selections are made with reference to the applications. In the viewpoint of durability, the shape of each of the parts is tentatively selected with a particular emphasis on the shape of the belt edge of the tread portion and the shape of the carcass turnup. Also in the viewpoint of the durability, the physical properties of the rubber material for each of the parts are tentatively selected.

Figure 2:
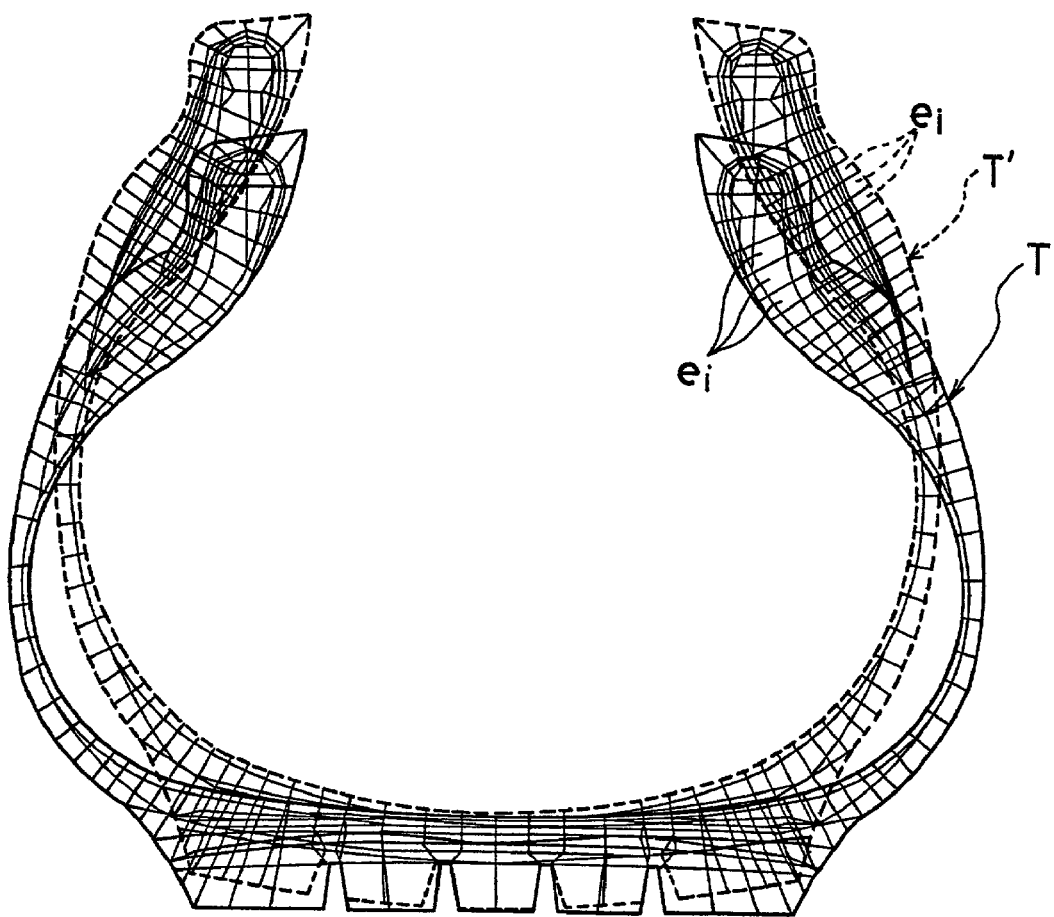
FIG. 2 is a view showing a model of finite elements, in which a pneumatic tire divided into many finite elements is illustrated in both states where the tire contacts to the ground and where the tire does not contact to the ground.

When the tentative selections of the shape of the tire, the shape of each part, and the physical properties of the rubber material are finished, next in step 12, calculation by the FEM is executed. The shapes and the physical properties tentatively selected in steps 10 and 11 are applied to each part in the FEM calculation. Specifically, each part is divided into many finite number of elements $e_i$ as shown in FIG. 2 such that mutual positional relations can be determined one by one using the three-dimensional coordinates x-y-z. Thereafter, each condition such as shape data, material data, boundary data and load data is applied to the respective elements, and then, the principal strain is calculated.

In the case of a tire, the FEM calculation is usually executed under the condition that internal pressure and vertical load are acted on the tire. However, in order to reproduce a situation more similar to an actual running of the tire, analysis may be executed for the cases where a braking force is applied to the tire, a centrifugal force is applied thereto and a cornering force is applied thereto. However, these calculations require a great amount of time. Therefore, the calculation under the condition that the internal pressure and the vertical load are acted on the tire is mainly conducted in general.

FIG. 2 shows a tire rolling while being under a specified load. Herein, solid lines show a tire T subjected to the load at the time of ground contact, and broken lines show a tire T' rotated 180° from the ground contact and released from the load of the ground contact load. In the FEM calculation, in each of the parts (i) of a tire whose shape is thus changed, the principal strain is calculated by inputting the shape data, the material data, the boundary data and the load data for each of the elements $e_i$ divided into a plurality.

Figure 3:
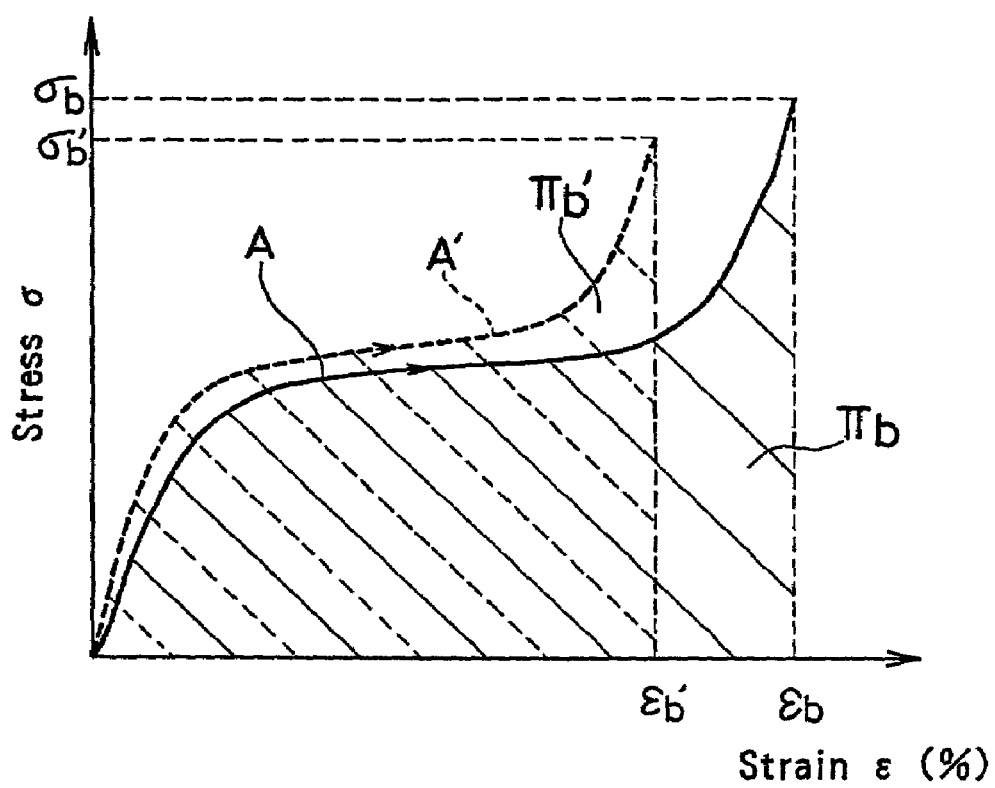
FIG. 3 is a graph showing an example of a stress-strain curve of a rubber material.

The physical properties of the rubber material have a stress-strain curve as shown in FIG. 3, for example. Specifically, when the rubber material is brand new, physical properties thereof can be shown as a curve A. On the other hand, when the rubber material is used for a specific period of time and deteriorated, the physical properties thereof change as shown as a curve A'. In the design of the rubber composite according to the present invention, the physical properties of the brand-new rubber material (curve A) are basically employed. However, it is also possible to utilize the physical properties of the deteriorated rubber material shown as the curve A' as described later.

A reinforcement such as a carcass layer and a belt layer may be evaluated according to the composite material theory in general. Details thereof can be referred to, for example, "Recent FRR Mechanics and Application" in the Journal of The Society of Rubber Industry, Japan, Vol. 61, No. 3, P187 (1988).

When the calculation of the principal strain of the plurality of finite elements $e_i$ is finished, the maximum strain $(\epsilon_i)_{max}$ of the elements in each of the parts (i) is obtained in the next step 13. Subsequently, an allowance ratio $S_{ia}$ of each maximum principal strain $(\epsilon_i)_{max}$ is calculated in the next step 14. The allowance ratio $S_{ia}$ is calculated based on the formula (1) shown below as a ratio of the maximum principal strain $(\epsilon_i)_{max}$ to the strain $(\epsilon_i)_b$ at break of the rubber material tentatively selected for each of the parts (i) in step 11.

$$S_{ia}=(\epsilon_i)_b/(\epsilon_i)_{max} \quad (1)$$

Next, in step 15, the allowance ratio $S_{ia}$ calculated in step 14 is compared with a reference allowance ratio $S_0$, which is set in advance. In this comparison, when the allowance ratio $S_{ia}$ calculated by the formula (1) is smaller than the reference allowance ratio $S_0$ ($S_{ia}<S_0$), the process returns to step 10, and the tire shape and the shape of each part are tentatively selected again so as to reverse the relation between the $S_{ia}$ and the $S_0$. Also, the physical properties of the rubber material of each part (i) are tentatively selected again in step 11. Using the data thus tentatively selected again, the FEM calculation of step 12 is conducted again. Then in step 13, the maximum principal strain $(\epsilon_i)_{max}$ is obtained from the elements of each part resulting from the FEM calculation, and the allowance ratio $S_{ia}$ is again obtained in step 14. Thereafter, the allowance ratio $S_{ia}$ is again compared with the reference allowance ratio $S_0$ in step 15.

The operations of steps 10, 11, 12, 13, 14, and 15 are to be repeated until the calculation result of the allowance ratio $S_{ia}$ satisfies the relation $S_{ia} \geq S_0$, and such operations are finished when the calculation result satisfies the relation $S_{ia} \geq S_0$. The tire shape, the shape of each part, and the physical properties of the rubber material at the time when the calculation is finished are determined as the targeted tire shape, targeted shape of each part, and the targeted physical properties of the rubber material. These operations can be easily executed by the use of commercially available computer software.

The calculation of the above-mentioned allowance ratio $S_{ia}$ is executed to all of the parts constituting the tire. However, with respect to the pneumatic radial tire, it has been experientially understood that the rubber material of the belt edge portion and the rubber material in the vicinity of the carcass turnup portion are apt to be broken. Therefore, the calculation of the allowance ratio $S_{ia}$ should be executed with a particular emphasis on the belt edge portion and the carcass turnup edge portion.

Furthermore, in the case where the allowance ratio is sufficiently large in a certain part of the tire, the allowance ratio thereof is preferably adjusted and decreased, and those of the surrounding parts are increased. If the allowance ratios in the tire are made even as a whole by these adjustments, an efficient design can be made possible.

In the present invention, though magnitude of the reference allowance ratio $S_0$ is not particularly limited, it is preferable that it is set in a range of 9 to 30. If the reference allowance ratio $S_0$ is lower than 9, there exists insecurity of durability. However, the reference allowance ratio $S_0$ higher than 30 is meaningless because the tire reaches its lifetime limit due to a ware limit of a tread thereof. The reference allowance ratio $S_0$ in the case where the rubber composite is a pneumatic tire is preferably set in a range of 9 to 30 if the pneumatic tire is used for a passenger car. Also, the reference allowance ratio $S_0$ is preferably set in a range of 12 to 30 if the pneumatic tire is used for the heavy loading.

Heretofore, in a design of a rigid structure and the like, there has been a concept of a safety ratio which is close to the concept of the allowance ratio adopted in the present invention. However, the safety ratio has been adopted to the rigidity structure such as steel having a strain-stress curve (S-S curve) that linearly changes in terms of material properties and has not been adopted generally to a material such as a rubber material having a non-linear S-S curve as shown in FIG. 3. Then, the inventors of the present invention conducted various examinations, and as a result, came to adopt the concept of the allowance ratio to the rubber material based on the following notions.

Specifically, in the rubber composite such as a pneumatic tire, a strength member for supporting external force is mainly a reinforcement such as steel cords and organic fabric cords having a linear S-S curve. A rubber material having a nonlinear S-S curve and low rigidity does not stably function as a strength member, and such a rubber material mainly lies between the reinforcements to supplement the same in order to hold air. However, the inventors of the present invention focused their attention onto the fact that the simulation result of the tire durability by the FEM calculation and the result of the tire durability test obtained from the actual running were not consistent with each other frequently as described above, and introduced the concept of the allowance ratio to the rubber material such that the simulation result by the FEM and the result of the actual durability test would be consistent with each other, and thus, the design of a rubber product by the FEM with high accuracy was made possible.

In the embodiment shown in FIG. 1, description was made for a case where the simulation was conducted on tire durability based on the strain of the rubber material. However, in the present invention, similarly to the case of the strain, the durability simulation can be conducted based on the stress or the strain energy density generated in the tire instead of the strain.

Specifically, in FIG. 1, instead of the maximum principal strain obtained in step 13, the maximum principal stress $(\sigma_j)_{max}$ and/or the maximum strain energy density $(\Pi_i)_{max}$ are obtained. Then, the allowance ratios $S_{ib}$ and $S_{ic}$ calculated in step 14 are respectively obtained from the following formulas (2) and/or (3) based on the maximum principal stress $(\sigma_j)_{max}$ and the stress $(\sigma_j)_b$ at break of the rubber material itself and/or based on the maximum strain energy density $(\Pi_i)_{max}$ and the density $(\Pi_i)_b$ of strain energy at break of the rubber material itself.

$$S_{ib}=(\sigma_j)_b/(\sigma_j)_{max} \quad (2)$$

$$S_{ic} = \sqrt{[(\Pi_i)_b/(\Pi_i)_{max}]} \quad (3)$$

Note that, concerning the strain energy density $\Pi$, a relation shown below is established with the strain $\epsilon$:

$$\Pi=(1/2)E\cdot\epsilon^2 \quad (4)$$

Therefore, as the allowance ratio $S_{ic}$ of the strain energy density, the square root of a ratio of the density $(\Pi_i)_b$ of strain energy at break to the density $(\Pi_i)_{max}$ of maximum strain energy is used.

Subsequently, the operations of steps 10, 11, 12, 13, 14 and 15 are repeated until the allowance ratios $S_{ib}$ and $S_{ic}$ calculated as described above satisfy the relations $S_{ib} \geq S_0$ and $S_{ic} \geq S_0$ with respect to the reference allowance ratio $S_0$. Then, the tire shape, the shape of each part and the physical properties of the rubber material satisfying the above-described relations are determined as final design values.

In the present invention, evaluations of the allowance ratio $S_{ib}$ based on the stress and the allowance ratio $S_{ic}$ based on the strain energy density may be analyzed solely to determine the tire shape, the shape of each part and the physical properties of the rubber material. However, they may be determined by combining with the allowance ratio $S_{ia}$ based on the above-described strain.

In addition, differing from the steel or the like, the rubber material has characteristics as follows. Specifically, the rubber material deteriorates by the use of itself as time passes as shown in FIG. 3. As the S-S curve changes from the curve A representing the brand-new rubber material to the curve A', the strain $\epsilon_b$ at break is reduced to $\epsilon_b'$, and the density of strain energy at break is also reduced from $\Pi_b$ to $\Pi_b'$. Similarly, in the case of the stress $\sigma$, the stress $\sigma_b$ at break of the brand-new rubber material is reduced to $\sigma_b'$. Taking such characteristics of the rubber in mind, the allowance ratio based on the above-described strain, stress and/or the strain energy density of the present invention may be evaluated based on the S-S curve A', which shows a rubber material deteriorated after the specified period of time.

As described above, in addition to the properties of the brand-new rubber, the evaluation based on the curve A' showing the rubber material deteriorated with the passage of time, is added to make it possible to design the tire by FEM with higher accuracy.

In the foregoing, the description was made for the method of designing in the case where the rubber composite was a pneumatic tire. However, the present invention can be applied to the design of other rubber composite such as a rubber hose and a conveyer belt.

According to the present invention as described above, by introducing the concept of the allowance ratio, the shape of the rubber composite, the shape of each part and the physical properties of the rubber material are determined such that the allowance ratios $S_{ia}$, $S_{ib}$ and $S_{ic}$ are equal to the specified reference allowance ratio $S_0$ or higher. Herein, the allowance ratio $S_{ia}$ is calculated as a ratio of the strain $(\epsilon_i)_b$ at break of the rubber material to the maximum principal strain $(\epsilon_i)_{max}$, the allowance ratio $S_{ib}$ is calculated as a ratio of the stress $(\sigma_j)_b$ at break to the maximum principal stress $(\sigma_j)_{max}$, and the allowance ratio $S_{ic}$ is calculated as the square root of a ratio of the density $(\Pi_i)_b$ of strain energy at break to the maximum strain energy density $(\Pi_i)_{max}$. Therefore, the durability simulation result by the FEM and the result of the actual durability test can be consistent with each other, and thus it is possible to further enhance the accuracy of the simulation by the FEM.

EXAMPLE

Radial pneumatic tires for heavy loading with specifications shown below were designed by calculating the allowance ratio $S_{ia}$ concerning the strain according to the following two procedures.

Specifications:
Tire size: 1000R20 16PR
Rim: 7.50V×20
Air pressure: 725 Kpa
Load: 2,000 Kg Procedures A tire shape, a shape of each part (i) constituting the tire were tentatively selected and physical properties of a rubber material used in each part (i) were tentatively selected. Thereafter, the tire was divided into many finite elements, and strain of the rubber material in each of the elements was calculated by the FEM. Then, the maximum principal strain $(\epsilon_i)_{max}$ in the elements in each part (i) was obtained, and an allowance ratio $S_{ia}$, which was a ratio of the strain $(\epsilon_i)_b$ at break of the rubber material selected in the foregoing to the maximum principal strain $(\epsilon_i)_{max}$, was calculated. As a result, the allowance ratio $S_{ia}$ of the belt edge portion was 10, and the allowance ratio $S_{ia}$ of the carcass turnup portion was 15 (Comparative Example).

Contrary to this, a tire was designed in such a manner that a reference allowance ratio $S_0$ was set to 12, and operations continued until the allowance ratio $S_{ia}$ of the belt edge portion in the above-described operations exceeded 12, which was the reference allowance ratio $S_0$ (Example).

Actual Running Test and Result

Five tires were manufactured respectively for the Comparative Example and the Example of the foregoing design. In each of the cases of the Comparative Example and the Example, a flat body vehicle having a maximum capacity load of 10 t was driven on a paved open road including 20% of an express way while loaded with 80% of the maximum load capacity. The vehicle was driven until recapped twice.

The detail examination of the tires in the belt edge portions and the carcass turnup portions were evaluated for the tires of the Comparative Example and the Example. With respect to the tires of the Comparative Example, the separation was found in the belt edge portions of all five tires. On the other hand, no separation was found in the tires of the Example. This result conformed to the design goal.

What is claimed is:

1. A computer implemented method of designing rubber composite comprising the steps of:

tentatively selecting a shape of the rubber composite, a shape of each part (i) constituting the rubber composite and physical properties of a rubber material used for each part (i) respectively;

dividing the rubber composite into many finite elements and calculating strain in each element by the finite element method to obtain maximum principal strain $(\epsilon_j)_{max}$ of the elements in each part (i);

repeating the tentative selections of the shape of the rubber composite, the shape of each part (i) and the physical properties of the rubber material and the calculations by the finite element method until an allowance ratio $S_{ia}$ calculated as a ratio of strain $(\epsilon_i)_b$ at break to the maximum principal strain $(\epsilon_i)_{max}$ becomes equal to a specified reference allowance ratio $S_0$ or higher in all of the parts (i); and determining the shape of the rubber composite, the shape of each part (i) and the physical properties of the rubber material;

wherein the reference allowance ratio $S_0$ is set in a range of 9 to 30.

2. A computer implemented method of designing rubber composite, comprising the steps of:

tentatively selecting a shape of the rubber composite, a shape of each part (i) constituting the rubber composite and physical properties of a rubber material used for each part (i) respectively;

dividing the rubber composite into many finite elements, and calculating stress in each element by the finite element method to obtain maximum principal stress $(\sigma_j)_{max}$ of the elements in each part (i);

repeating the tentative selections of the shape of the rubber composite, the shape of each part (i) and the physical properties of the rubber material and the calculations by the finite element method until an allowance ratio $S_{ib}$ calculated as a ratio of stress $(\sigma_i)_b$ at break to the maximum principal stress $(\sigma_i)_{max}$ becomes equal to a specified reference allowance ratio $S_0$ or higher in all of the parts (i); and determining the shape of the rubber composite, the shape of each part (i) and the physical properties of the rubber material;

wherein the reference allowance ratio $S_0$ is set in a range of 9 to 30.

3. A computer implemented method of designing rubber composite, comprising the steps of:

tentatively selecting a shape of the rubber composite, a shape of each part (i) constituting the rubber composite and physical properties of the rubber material used for each part (i) respectively;

dividing the rubber composite into many finite elements, and calculating strain energy in each element by the finite element method to obtain density $(\Pi_i)_{max}$ of maximum strain energy of the elements in each part (i);

repeating the tentative selections of the shape of the rubber composite, the shape of each part (i) and the physical properties of the rubber material and the calculations by the finite element method are repeated until an allowance ratio $S_{ic}$ calculated as a square root of a ratio of density $(\Pi_i)_b$ of strain energy at break to the maximum strain energy density $(\Pi_i)_{max}$ becomes equal to a specified reference allowance ratio $S_0$ or higher in all of the parts (i); and determining the shape of the rubber composite, the shape of each part (i) and the physical properties of the rubber material;

wherein the reference allowance ratio $S_0$ is set in a range of 9 to 30.

4. The computer implemented method of designing the rubber composite according to any one of claims 1, 2 and 3, wherein the rubber composite is a pneumatic tire.

* * * * *